(12) United States Patent
Nishioka et al.

(10) Patent No.: US 9,591,771 B2
(45) Date of Patent: *Mar. 7, 2017

(54) PRINTED WIRING BOARD AND METHOD FOR MANUFACTURING PRINTED WIRING BOARD

(71) Applicant: IBIDEN Co., Ltd., Ogaki-shi (JP)

(72) Inventors: Hiroyuki Nishioka, Ogaki (JP); Shinsuke Ishikawa, Ogaki (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 51 days.

This patent is subject to a terminal disclaimer.

(21) Appl. No.: 14/564,126

(22) Filed: Dec. 9, 2014

(65) Prior Publication Data

US 2015/0163901 A1 Jun. 11, 2015

(30) Foreign Application Priority Data

Dec. 9, 2013 (JP) .................. 2013-253837

(51) Int. Cl.
*H05K 1/09* (2006.01)
*C08F 2/46* (2006.01)
(Continued)

(52) U.S. Cl.
CPC ....... *H05K 3/4644* (2013.01); *H01L 21/4846* (2013.01); *H01L 23/145* (2013.01);
(Continued)

(58) Field of Classification Search
CPC ...... H05K 1/0298; H05K 1/0346; H05K 1/09; H05K 1/115; H05K 2201/0154;
(Continued)

(56) References Cited

U.S. PATENT DOCUMENTS 4,526,806 A * 7/1985 Haque .................. B05D 1/62
427/255.6
7,022,412 B2 * 4/2006 Yoshida ............... B32B 15/08
174/255
(Continued)

FOREIGN PATENT DOCUMENTS

JP 2000-307225 A 11/2000
JP 2012-191204 A 10/2012

OTHER PUBLICATIONS

U.S. Appl. No. 14/564,122, filed Dec. 9, 2014, Nishioka, et al.

*Primary Examiner* — Chau N Nguyen
*Assistant Examiner* — Roshn Varghese
(74) *Attorney, Agent, or Firm* — Oblon, McClelland, Maier & Neustadt, L.L.P.

(57) ABSTRACT

A printed wiring board includes resin insulation layers, conductive layers formed on the resin insulation layers respectively such that each of the conductive layers is formed on a surface of each of the resin insulation layers, and via conductors penetrating through the resin insulation layers respectively such that the via conductors are connecting the conductive layers through the resin insulation layers. The conductive layers and the via conductors are formed such that each of the conductive layers and each of the via conductors includes an electroless copper-plated film, an intermediate compound layer having $Cu_3N+Cu(NH)x$ and formed on the electroless copper-plated film, and an electrolytic copper-plated film formed on the intermediate compound layer.

20 Claims, 6 Drawing Sheets

(51) Int. Cl.
  *C08J 7/18*    (2006.01)
  *H05H 1/00*    (2006.01)
  *H05H 1/24*    (2006.01)
  *H05K 3/46*    (2006.01)
  *H01L 23/14*   (2006.01)
  *H01L 23/498*  (2006.01)
  *H01L 21/48*   (2006.01)

(52) U.S. Cl.
  CPC .. *H01L 23/49816* (2013.01); *H01L 23/49822* (2013.01); *H01L 2924/0002* (2013.01); *H01L 2924/12042* (2013.01); *H05K 2201/09472* (2013.01); *H05K 2201/09563* (2013.01); *H05K 2203/095* (2013.01)

(58) Field of Classification Search
  CPC . H05K 2201/0158; H05K 2201/09563; H05K 2201/09472; H05K 2203/095; H05K 3/4644; H05K 2201/0341; H01L 21/4857; H01L 21/486; H01L 2924/00; H01L 2924/0002; H01L 2924/12042; H01L 23/49582
  See application file for complete search history.

(56) References Cited

U.S. PATENT DOCUMENTS

| | | | | |
|---|---|---|---|---|
| 7,033,648 | B1* | 4/2006 | Doany | C23C 18/1605 |
| | | | | 427/125 |
| 2002/0162687 | A1* | 11/2002 | Akihiko | H05K 3/389 |
| | | | | 174/262 |
| 2006/0118133 | A1* | 6/2006 | Suzuki | B08B 7/0035 |
| | | | | 156/345.31 |
| 2009/0056994 | A1* | 3/2009 | Kuhr | C23C 18/1653 |
| | | | | 174/259 |
| 2009/0078451 | A1* | 3/2009 | Niki | H05K 3/4682 |
| | | | | 174/250 |
| 2009/0229874 | A1* | 9/2009 | Katagiri | H05K 3/0035 |
| | | | | 174/262 |
| 2010/0189974 | A1* | 7/2010 | Ochi | B32B 15/08 |
| | | | | 427/304 |
| 2011/0114375 | A1* | 5/2011 | Ohmi | H05K 3/381 |
| | | | | 174/257 |
| 2011/0168430 | A1* | 7/2011 | Hata | H05K 3/389 |
| | | | | 174/126.1 |
| 2013/0299079 | A1* | 11/2013 | Manabe | B32B 7/12 |
| | | | | 156/272.6 |

* cited by examiner

FIG. 6(B) ↓ N2+H2 Plasma

High-density NH⁺ Radical

PRINTED WIRING BOARD AND METHOD FOR MANUFACTURING PRINTED WIRING BOARD

CROSS-REFERENCE TO RELATED APPLICATIONS

The present application is based upon and claims the benefit of priority to Japanese Patent Application No. 2013-253837, filed Dec. 9, 2013, the entire contents of which are incorporated herein by reference.

BACKGROUND OF THE INVENTION

Field of the Invention

The present invention relates to a printed wiring board where a conductive layer is made up of electroless copper-plated film, plating resist provided on the electroless copper-plated film, and electrolytic plated film deposited where no plating resist is formed. The present invention also relates to a method for manufacturing such a printed wiring board.

Description of Background Art

JP2000-307225A describes a method for manufacturing a printed wiring board by employing a semi-additive method to form a conductive layer made of electroless copper-plated film and electrolytic plated film. The method is as follows: electroless copper-plated film is formed on an interlayer resin insulation layer, plating resist is formed on the electroless copper-plated film, electrolytic plated film is deposited where the plating resist is not formed, the plating resist is removed, and the electroless copper-plated film is removed from where the electrolytic plated film is not formed. The entire contents of this publication are incorporated herein by reference.

SUMMARY OF THE INVENTION

According to one aspect of the present invention, a printed wiring board includes resin insulation layers, conductive layers formed on the resin insulation layers respectively such that each of the conductive layers is formed on a surface of each of the resin insulation layers, and via conductors penetrating through the resin insulation layers respectively such that the via conductors are connecting the conductive layers through the resin insulation layers. The conductive layers and the via conductors are formed such that each of the conductive layers and each of the via conductors includes an electroless copper-plated film, an intermediate compound layer having $Cu_3N+Cu(NH)x$ and formed on the electroless copper-plated film, and an electrolytic copper-plated film formed on the intermediate compound layer.

According to another aspect of the present invention, a method for manufacturing a printed wiring board includes irradiating laser upon a resin insulation layer such that a via opening is formed in the resin insulation layer, applying electroless plating on the resin insulation layer such that an electroless copper-plated film is formed on a surface of the resin insulation layer and in the via opening, applying microwave plasma treatment on the electroless copper-plated film formed on the surface of the resin insulation layer and in the via opening such that an intermediate compound layer having $Cu_3N+Cu(NH)x$ is formed on the electroless copper-plated film on the surface of the resin insulation layer and in the via opening, forming a plating resist layer having a plating-resist pattern on the intermediate compound layer, applying electrolytic plating on a portion of the intermediate compound layer exposed from the plating resist layer such that an electrolytic copper-plated film is on the portion of the intermediate compound layer exposed from the plating resist layer, a via conductor including the electroless copper-plated film, the intermediate compound layer and the electrolytic copper-plated film is formed in the via opening, and a conductive layer including the electroless copper-plated film, the intermediate compound and the electrolytic copper-plated film is formed on the surface of the resin insulation layer, removing the plating resist layer from the intermediate compound layer, and removing a portion of the intermediate compound and a portion of the electroless copper-plated film exposed from the electrolytic copper-plated film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6(A)-6(C) are views schematically showing plasma treatment.

DETAILED DESCRIPTION OF THE EMBODIMENTS

Figure 1A:
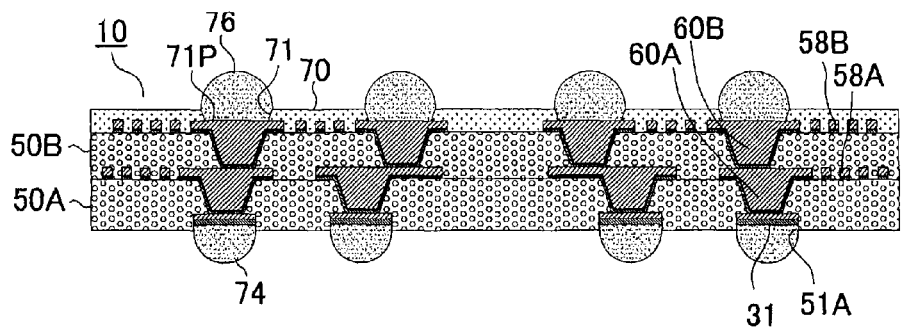
FIG. 1(A) is a cross-sectional view of a printed wiring board according to a first embodiment of the present invention.

The embodiments will now be described with reference to the accompanying drawings, wherein like reference numerals designate corresponding or identical elements throughout the various drawings.

Figure 1B:
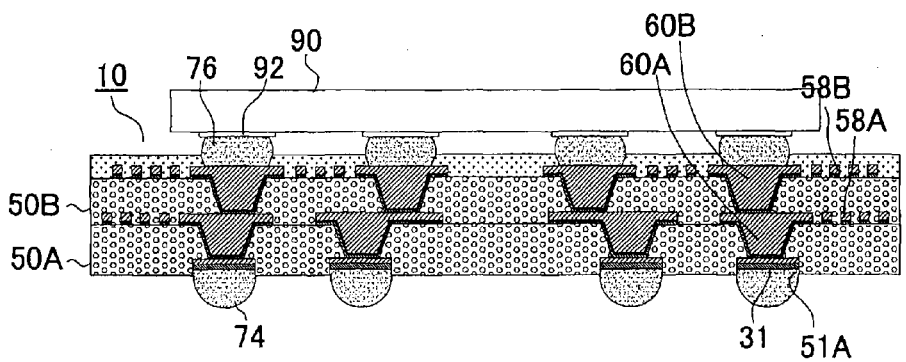
FIG. 1(B) is a cross-sectional view showing an applied example where an IC chip is mounted on the printed wiring board in FIG. 1(A)
Figure 1C:
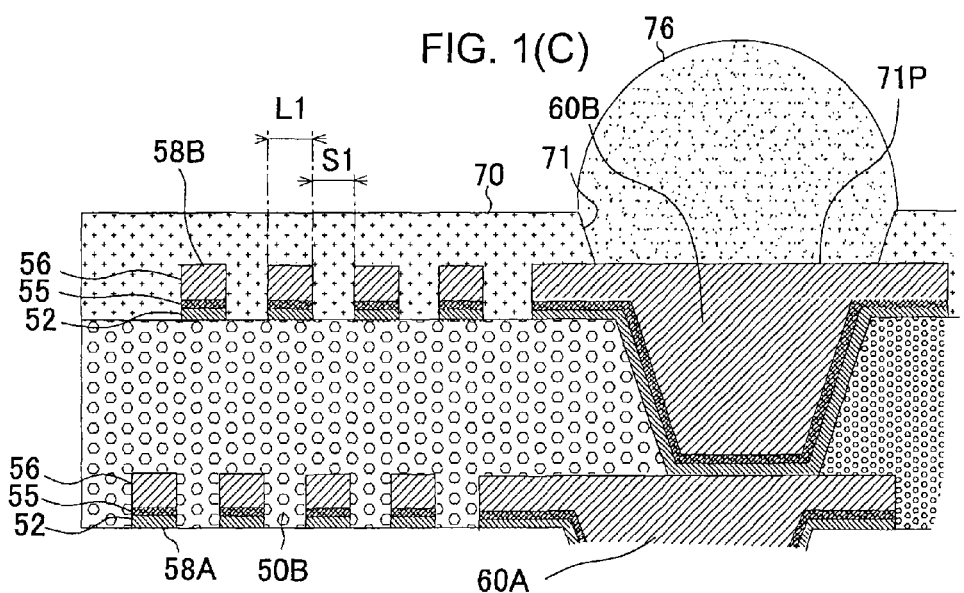
FIG. 1(C) is a partially enlarged view of FIG. 1(A)

FIG. 1(A) is a cross-sectional view of a printed wiring board according to a first embodiment, FIG. 1(B) is a cross-sectional view showing an applied example where an IC chip is mounted on the printed wiring board in FIG. 1(A), and FIG. 1(C) is a partially enlarged view of FIG. 1(A).

As shown in FIG. 1(A), printed wiring board 10 has first resin insulation layer (50A) and second resin insulation layer (50B). Recess (51A) is formed on the lower-surface side of first resin insulation layer (50A), and pad 31 is formed in the recess (51A). Solder bump 74 is formed on pad 31. The printed wiring board is structured not to have a solder-resist layer on the lower-surface side, where a solder bump is formed in recess (51A). First conductive layer (58A) is formed on the upper surface of first resin insulation layer (50A), and first conductive layer (58A) is connected to pad 31 by first via conductor (60A) which penetrates through first resin insulation layer (50A). First conductive layer (58A) includes the via land of first via conductor (60A). Second conductive layer (58B) is formed on the upper surface of second resin insulation layer (50B), and second conductive layer (58B) is connected to first conductive layer (58A) by second via conductor (60B) which penetrates through second resin insulation layer (50B). Second conductive layer (58B) includes the via land of second via conductor (60B). Second conductive layer (58B) and second resin insulation layer (50B) are covered by solder-resist layer 70, and pad portion (71P) of second conductive layer (58B) is exposed through opening 71 formed in solder-resist layer 70. Solder bump 76 is formed on pad portion (71P).

As shown in FIG. 1(C), first conductive layer (58A), second conductive layer (58B), first via conductor (60A) and second via conductor (60B) are triple layered, having electroless copper-plated film 52 formed by electroless plating, intermediate compound 55 of C≡N+C–NH$_2$ formed by a microwave-excited plasma treatment, and electrolytic copper-plated film 56 formed by electrolytic plating.

First resin insulation layer (50A) and second resin insulation layer (50B) are formed, mainly containing epoxy resin, phenolic resin, polyimide resin, polyphenylene resin, polyolefin resin or fluororesin. Intermediate compounds (55, 55) of first conductive layer (58A) and second conductive layer (58B) each have a thickness of 1~10 nm. A microwave-excited plasma treatment for forming intermediate compounds 55 is carried out in a mixed atmosphere of nitrogen gas and hydrogen gas.

In a printed wiring board of the first embodiment, first conductive layer (58A), second conductive layer (58B), first via conductor (60A) and second via conductor (60B) are made up of electroless copper-plated film 52 formed by electroless plating, intermediate compound 55 of Cu$_3$N+Cu(NH)x formed on electroless plated film 52, and electrolytic copper-plated film 56 formed on the intermediate compound. Namely, plating resist is provided after intermediate compound 55 of Cu$_3$N+Cu(NH)x has been formed on electroless copper-plated film 52, and then electrolytic copper-plated film 56 is formed thereon. Since intermediate compound 55 of Cu$_3$N+Cu(NH)x exhibits excellent adhesiveness to the plating-resist layer, the fine-pattern plating resist is achieved, and first and second conductive layers (58A, 58B) are set to have a fine pitch. Namely, as shown in FIG. 1(C), a fine-pitch wiring line having line width (L1): 3 μm and space width (S1): 3 μm is formed in the first conductive layer. Conductive patterns with a line width up to 10 μm and a space width up to 10 μm can be preferably formed according to the first embodiment.

Manufacturing Method in First Embodiment

A method for manufacturing a printed wiring board according to the first embodiment is described below with reference to FIG. 2~6.

Figure 2A:
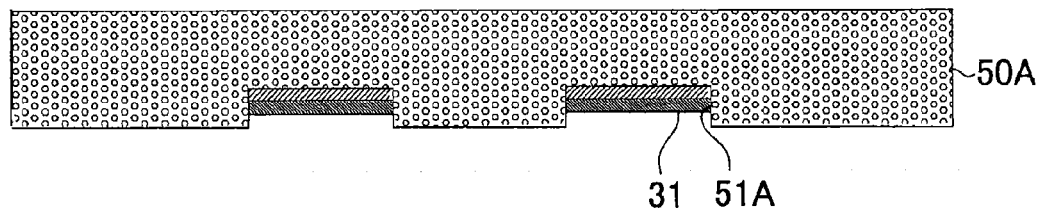
FIG. 2(A)-2(D) are views showing manufacturing steps of a printed wiring board of the first embodiment.

(1) First resin insulation layer (50A) is prepared where recess (51A) is formed on the lower surface side, and pad 31 is formed in recess (51A) as shown in FIG. 2(A). The lower-surface side of first resin insulation layer (50A) is held by a support plate (not shown), and a printed wiring board will be separated from the support plate upon completion of the printed wiring board. First resin insulation layer (50A) having pad 31 is manufactured using a method described in JP 2012-191204A, for example. The entire contents of this publication are incorporated herein by reference.

First resin insulation layer (50A) is made of epoxy resin and contains inorganic filler or the like. Alternatively, the first resin insulation layer may be a film-type resin insulation layer containing glass cloth obtained by impregnating a glass-fiber cloth with epoxy resin and by thermosetting the resin. However, the material for each resin insulation layer is not limited to those, and any other material may also be used.

Figure 2B:
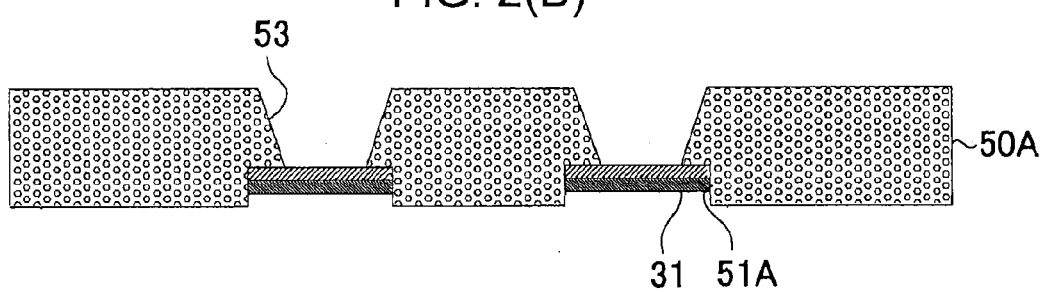

(2) In first resin insulation layer (50A), opening 53 is formed to reach pad 31 by using a laser (FIG. 2(B)). Here, opening 53 is a via opening in which to form a via conductor.

(3) By conducting electroless copper plating, 1 μm-thick electroless copper plated film 52 is formed on the surface of first resin insulation layer (50A) and in opening 53. Accordingly, first intermediate body 101 is completed (FIG. 2(C)).

Figure 2C:
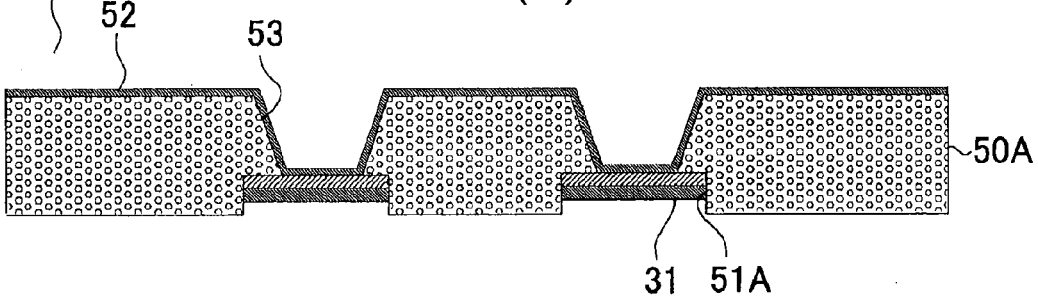
Figure 2D:
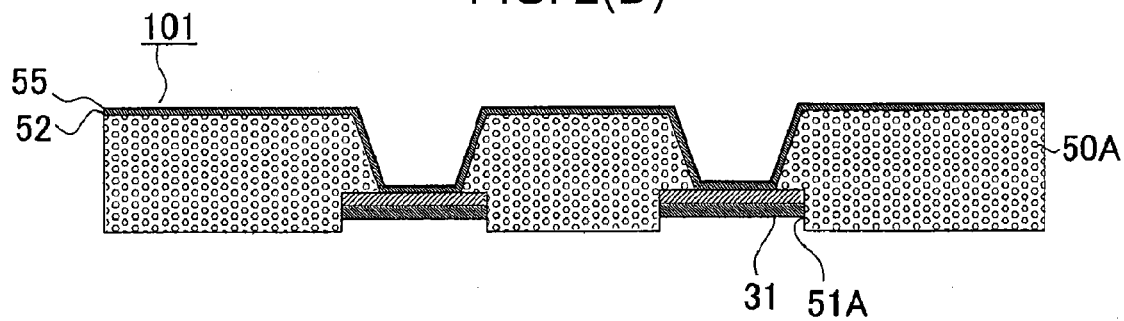

(4) A microwave-excited plasma treatment is conducted on first intermediate body 101, and intermediate compound 55 of Cu$_3$N+Cu(NH)x is formed on a surface of electroless copper-plated film 52 (FIG. 2(D)). The thickness of intermediate compound 55 is 1~10 nm. The microwave-excited plasma treatment is conducted by accommodating the first intermediate body in a vacuum chamber of a microwave-excited plasma treatment apparatus. A mixed atmosphere of nitrogen gas and hydrogen gas is set in the vacuum chamber.

(5) The number of radicals generated in a microwave-excited plasma treatment is significantly high and thus high reactivity is observed. Namely, since the frequency is high and newly generated electrons are constantly accelerated, the plasma density is high. In addition, since the distance is long from where the plasma is generated to the substrate (first intermediate body 101), ions and electrons in the plasma are bonded again and disappear, leaving behind radicals, which are highly effective for chemical modifications or ashing. Also, since microwave-excited plasma treatment is capable of carrying out chemical modifications at low temperature, damage to the substrate (first intermediate body 101) is low. Namely, since plasma passes through a dielectric body and is introduced into the vacuum chamber, the energy is absorbed in the dielectric body and microwaves are prevented from coming into the vacuum chamber. As a result, the plasma on the substrate has low electron energy, and the temperature of the substrate is kept from rising.

A microwave-excited plasma treatment is conducted under the following conditions: concentration of the hydrogen gas in a mixed atmosphere of nitrogen gas and hydrogen gas at a volume ratio of 0.1~5%; pressure of 25~100 Pa; flow rate of 300~1200 sccm for N2 gas and 10~50 sccm for H2 gas; microwave frequency of 2.56 GHz; input electricity of 3 kW; treatment time of 20~60 seconds; and treatment temperature of 150° C. or lower but 30° C. or higher.

Figure 6A:
Figure 6A:
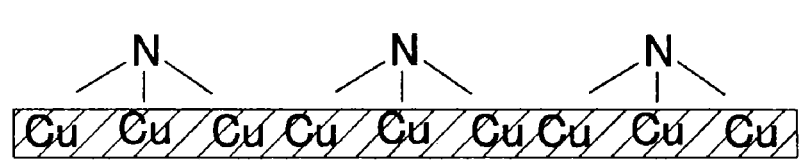
Figure 6C:
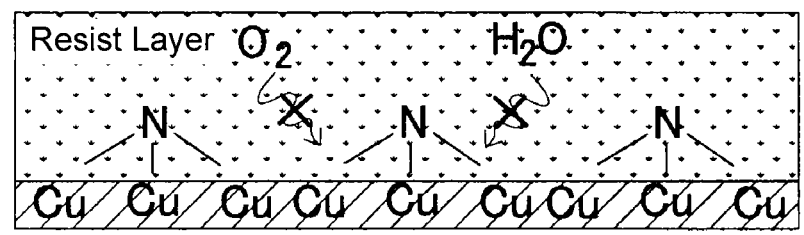

FIG. 6 is a view schematically showing surface modification of a conductive layer by a microwave-excited plasma treatment.

On a surface of electroless copper-plated film made of Cu shown in FIG. 6(A), an oxide layer of Cu$_2$O is generated. When N$_2$+H$_2$ plasma is exerted, the oxide layer Cu$_2$O is reduced to Cu by a large number of NH* radicals and Cu$_3$N is introduced. As a result, Cu$_3$N+Cu(NH)x is formed on the surface of electroless copper-plated film and functional groups are attached to the surface (FIG. 6(B)). Because of Cu$_3$N, oxidation of Cu caused by O$_2$ or H$_2$O is prevented, improving adhesiveness between Cu and the plating resist (FIG. 6(C)).

Figure 3A:
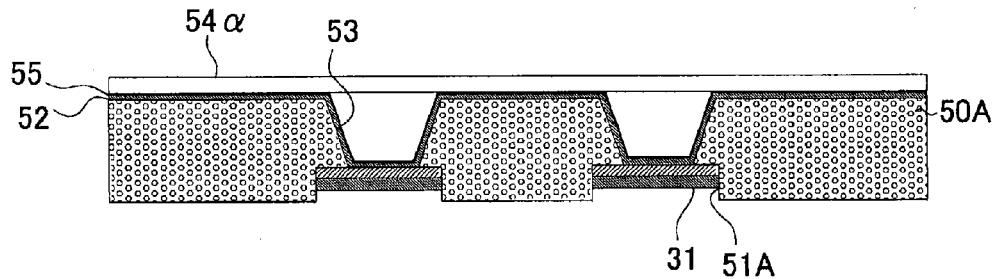
FIG. 3(A)-3(D) are views showing manufacturing steps of a printed wiring board of the first embodiment.
Figure 3B:
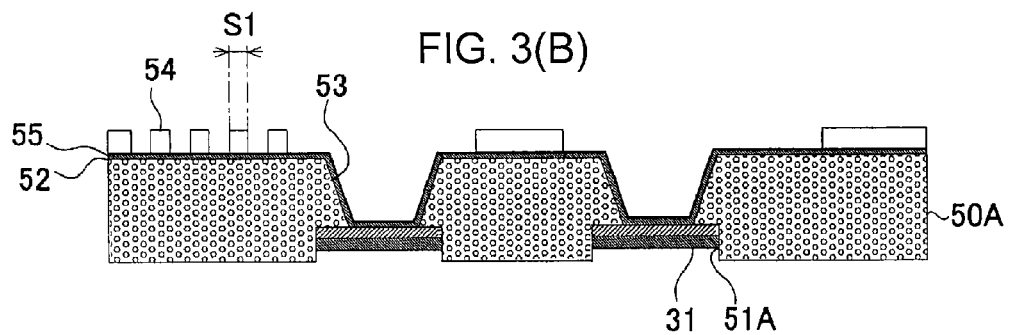

(5) Plating resist composition (54α) is applied to intermediate compound 55 (FIG. 3(A)), and is then exposed to light and developed. Accordingly, plating-resist layer 54 with a predetermined pattern is formed (FIG. 3(B)). As described earlier, because of the functional groups (intermediate compound 55), the adhesiveness of plating-resist layer 54 is improved. A fine-pattern resist layer having a space width of (S1): 3 μm does not peel off as described above with reference to FIG. 1(C).

Figure 3C:
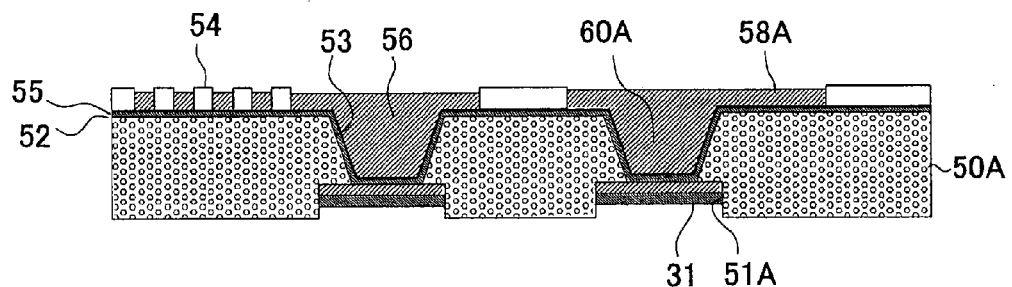

(6) By conducting electrolytic copper plating, electrolytic copper-plated film 56 is formed where no copper-plating resist is formed (FIG. 3(C)). At that time, electrolytic copper-plated film is filled in the inner portion of electroless copper-plated film 52 and intermediate compound 55 formed on the inner wall of opening 53 so as to form first via conductor (60A), while first conductive layer (58A) made of electroless copper-plated film 52 and electrolytic copper-plated film 56 is formed on the upper-surface side. The thickness of first conductive layer (58A) is 15 μm~20 μm.

Figure 3D:
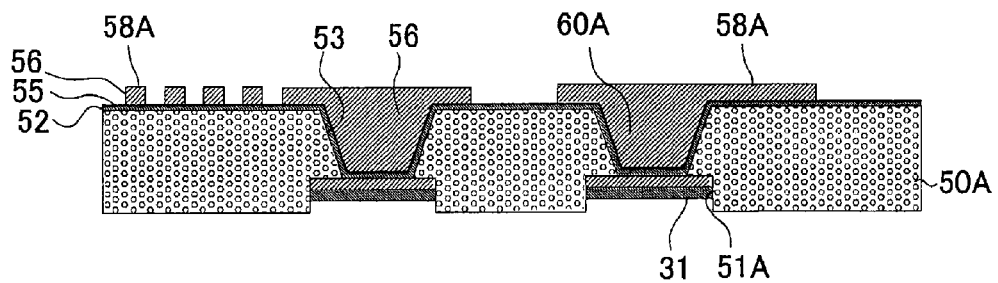

(7) The copper-plating resist is removed (FIG. 3(D)). Intermediate compound 55 and electroless copper-plated film 52 are removed from portions where no electrolytic copper-plated film 56 is formed. Accordingly, first conductive layer (58A) is formed on first resin insulation layer (50A) (FIG. 4(A)).

Figure 4A:
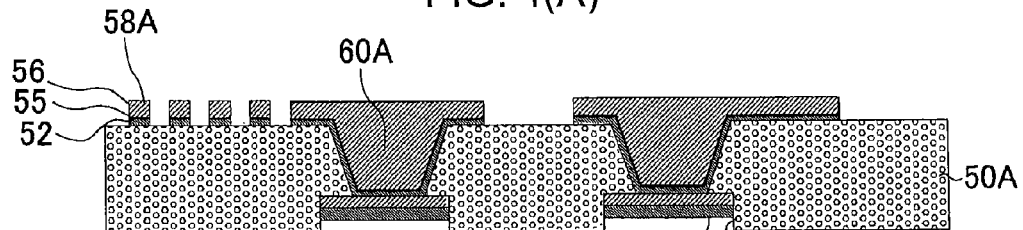
FIG. 4(A)-4(D) are views showing manufacturing steps of a printed wiring board of the first embodiment.
Figure 4B:
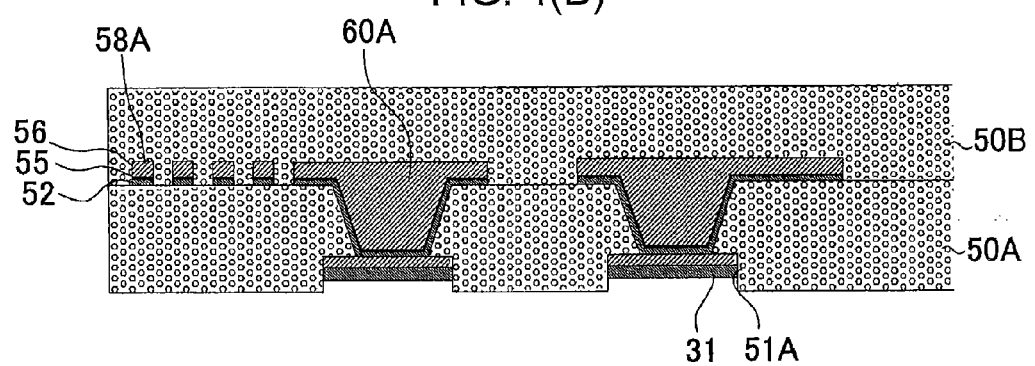
Figure 4C:
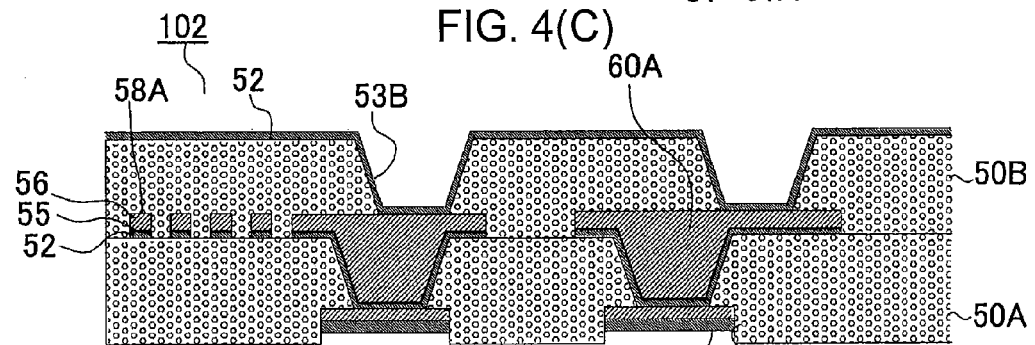

(8) On first resin insulation layer (50A) with first conductive layer (58A) formed thereon, second resin insulation layer (50B) made of the same material as that of the first resin insulation layer is laminated (FIG. 4(B)).

(9) By employing the same step shown in FIG. 2(B), opening (53B) is formed, and 1 μm-thick electroless copper-plated film 52 is formed by employing the same step shown in FIG. 2(C). Accordingly, second intermediate body 102 is completed (FIG. 4(C)).

Figure 4D:
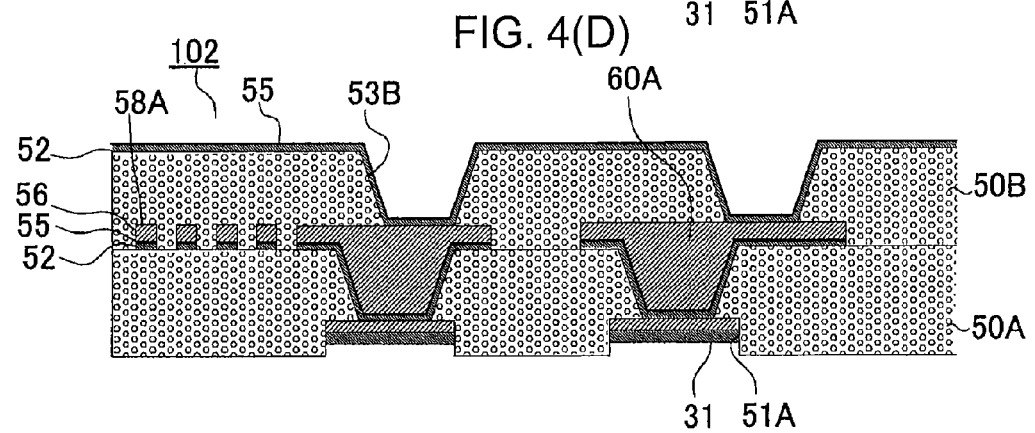

(10) A microwave-excited plasma treatment is conducted on second intermediate body 102, and intermediate compound 55 of $Cu_3N+Cu(NH)x$ is formed on a surface of electroless copper-plated film 52 (FIG. 4(D)). The thickness of intermediate compound 55 is 1~10 nm. The microwave-excited plasma treatment is conducted by accommodating the first intermediate body in the vacuum chamber of a microwave-excited plasma treatment apparatus.

Figure 5A:
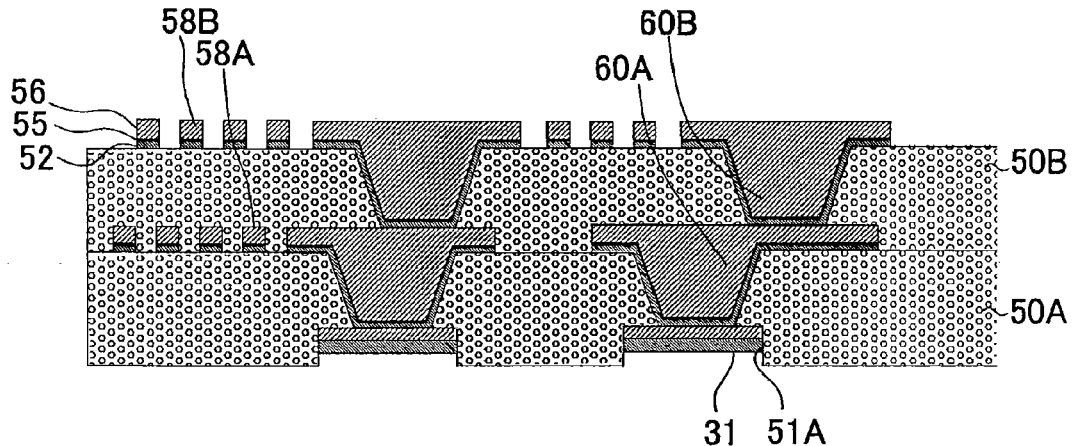
FIG. 5(A)-5(C) are views showing manufacturing steps of a printed wiring board of the first embodiment.

(11) The same as described above with reference to FIG. 3(A)-3(D), second via conductor (60B) is formed in second resin insulation layer (50B), and second conductive layer (58B) is formed on second resin insulation layer (50B) (FIG. 5(A)).

Figure 5B:
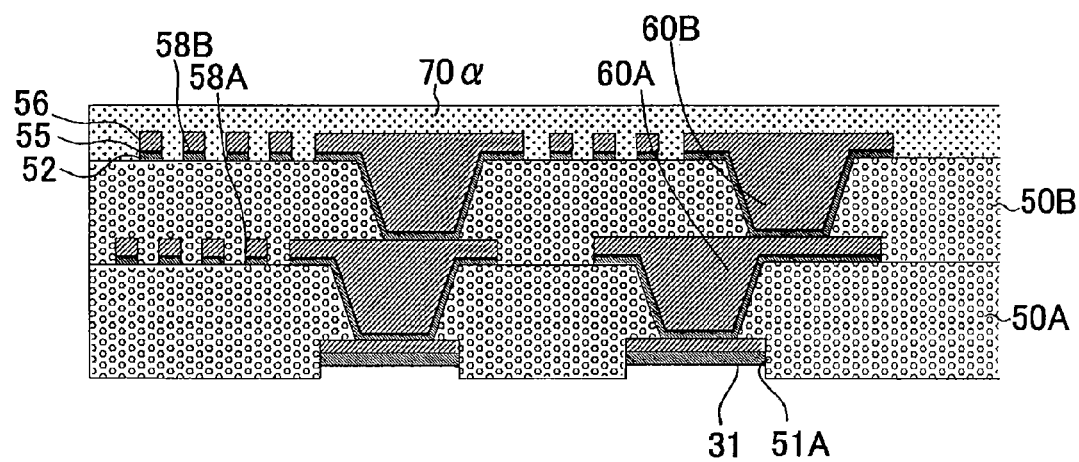
Figure 5C:
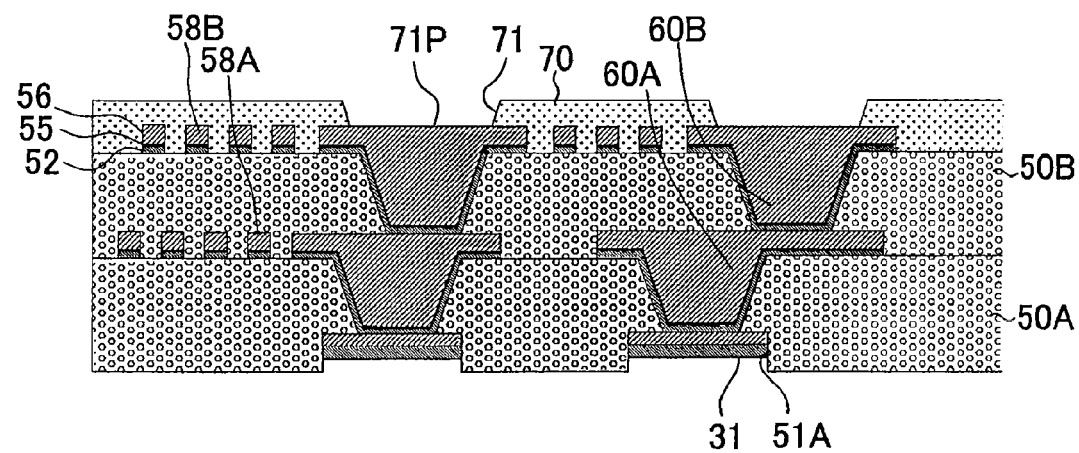

(12) Solder-resist composition (70α) is applied on second resin insulation layer (50B) (FIG. 5(B)), and is exposed to light and developed to form solder-resist layer 70 having opening 71 to expose pad portion (71P) of the second conductive layer (FIG. 5(C)). Here, the aforementioned support plate (not shown) is separated from the printed wiring board. OSP film or metal film such as Ni/Au film, Ni/Pd/Au film or Sn film may be formed on pad portion (71P) and pad 31.

(13) Solder balls are loaded on pad portion (71P) and pad 31, and a reflow is conducted to form solder bumps (76, 74). Accordingly, printed wiring board 10 is completed (FIG. 1(A)).

Pad 92 of an IC chip is connected through solder bump 76 of the printed wiring board. Accordingly, IC chip 90 is mounted on the printed wiring board (FIG. 1(B)).

In a method for manufacturing a printed wiring board according to the first embodiment, electroless plating is conducted to form electroless copper-plated film 52 on surfaces of resin insulation layers (50A, 50B) and in via openings (53, 53B), a microwave-excited plasma treatment is conducted on electroless copper-plated film 52 so as to form intermediate compound 55 of $Cu_3N+Cu(NH)x$ on the electroless copper-plated film, and then plating-resist composition (54α) is applied to cover intermediate compound 55, and is exposed to light and developed so that plating-resist pattern 54 is formed. Next, electrolytic plating is conducted to form electrolytic copper-plated film 56 where no plating-resist pattern 54 is formed so as to form via conductors (60A, 60B) and conductive layers (58A, 58B) made up of electroless copper-plated film 52, intermediate compound 55 and electrolytic copper-plated film 56. Since an intermediate compound of $Cu_3N+Cu(NH)x$ is formed on electroless copper-plated film and then plating resist is formed on the intermediate compound, a fine-pattern plating-resist layer is achieved because intermediate compound 55 of $Cu_3N+Cu(NH)x$ exhibits excellent adhesiveness to plating resist layer 54. As a result, fine-pitch conductive layers (58A, 58B) are obtained.

In the above embodiment, a coreless buildup printed wiring board is shown. However, the present invention may also be applied to a buildup printed wiring board with a core substrate.

When the space width in a conductive layer is reduced to achieve a highly integrated wiring board, fine-pitch plating resist is formed. However, when a conductive layer is formed by using a semi-additive method, low adhesiveness between the plating resist and electroless copper-plated film tends to cause a fine-pattern plating resist to peel off from the electroless copper-plated film, making it difficult to form a wiring layer with a narrow space width.

A printed wiring board according to an embodiment of the present invention and a method for manufacturing a printed wiring board according to an embodiment of the present invention have fine-pattern conductive layers.

A printed wiring board according to an embodiment of the present invention has a resin insulation layer, a conductive layer formed on a surface of the resin insulation layer, and a via conductor which penetrates through the resin insulation layer and connects the conductive layer on the resin insulation layer to the opposite surface side. The printed wiring board is formed by alternately laminating a conductive layer and a resin insulation layer. In addition, the conductive layer and the via conductor are made up of electroless copper-plated film, an intermediate compound of $Cu_3N+Cu(NH)x$ formed on the electroless copper-plated film, and electrolytic copper-plated film formed on the intermediate compound.

A method for manufacturing a printed wiring board according to an embodiment of the present invention includes the following: forming a via opening in a resin insulation layer by using a laser; by conducting electroless plating, forming electroless copper-plated film on a surface of the resin insulation layer and in the via opening; forming an intermediate compound of $Cu_3N+Cu(NH)x$ on the electroless copper-plated film by a microwave-excited plasma treatment conducted on the electroless copper-plated film; forming a plating-resist pattern by laminating plating resist on the intermediate compound and by conducting exposure and developing processes; by conducting electrolytic plating, forming electrolytic copper-plated film on portions where no plating-resist pattern is formed so as to form in the via opening a via conductor made up of the electroless copper-plated film, the intermediate compound and the electrolytic copper-plated film, while forming on the surface of the resin insulation layer a conductive layer made up of the electroless copper-plated film, the intermediate compound and the electrolytic copper-plated film; removing the plating-resist pattern; and removing the intermediate compound and the electroless copper-plated film from where the electrolytic copper-plated film is not formed.

In a printed wiring board according to an embodiment of the present invention, a conductive layer and a via conductor are formed, being made up of electroless copper-plated film, an intermediate compound of $Cu_3N+Cu(NH)x$ formed on the electroless copper-plated film, and electrolytic copper-plated film formed on the intermediate compound. Namely, plating resist is provided where an intermediate compound of $Cu_3N+Cu(NH)x$ has been formed on electroless copper-plated film, and then electrolytic copper-plated film is formed thereon. Since an intermediate compound of $Cu_3N+Cu(NH)x$ has excellent adhesiveness to the plating-resist layer, a fine-pattern plating-resist layer is achieved, thus the conductive layer is set to have a fine pitch.

In a method for manufacturing a printed wiring board according to an embodiment of the present invention, a plating-resist pattern is formed as follows: electroless plating is conducted to form electroless copper-plated film on a surface of a resin insulation layer and in a via opening; a microwave-excited plasma treatment is conducted on the electroless copper-plated film so as to form an intermediate compound of $Cu_3N+Cu(NH)x$ on the electroless copper-plated film; and plating resist is laminated on the intermediate compound and is exposed to light and developed. Then, electrolytic plating is conducted to provide electrolytic copper-plated film on portions where no plating-resist pattern is formed. Accordingly, a via conductor and a conductive layer are formed, being made up of the electroless copper-plated film, the intermediate compound and the electrolytic copper-plated film. Since an intermediate compound of $Cu_3N+Cu(NH)x$ is formed on electroless copper-plated film and then plating resist is formed on the intermediate compound, a fine-pattern plating-resist layer is achieved because the intermediate compound of $Cu_3N+Cu(NH)x$ has excellent adhesiveness to the plating resist. As a result, a fine-pitch conductive layer is obtained.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   a plurality of resin insulation layers;
   a plurality of conductive layers formed on the resin insulation layers respectively such that each of the conductive layers is formed on a surface of each of the resin insulation layers; and
   a plurality of via conductors penetrating through the resin insulation layers respectively such that the plurality of via conductors is connecting the plurality of conductive layers through the resin insulation layers,
   wherein the plurality of conductive layers and the plurality of via conductors are formed such that each of the conductive layers and each of the via conductors comprise an electroless copper-plated film, an intermediate compound layer comprising $Cu_3N+Cu(NH)x$ and formed on the electroless copper-plated film, and an electrolytic copper-plated film formed on the intermediate compound layer.

2. A printed wiring board according to claim 1, wherein the intermediate compound layer comprising $Cu_3N+Cu(NH)x$ is formed on the electroless copper-plated film through application of microwave plasma treatment on the electroless copper-plated film in a mixed gas atmosphere comprising a nitrogen gas and a hydrogen gas.

3. A printed wiring board according to claim 2, wherein the intermediate compound layer formed on the electroless copper-plated film has a thickness in a range of from 1 nm to 10 nm.

4. A printed wiring board according to claim 2, wherein each of the conductive layers has a conductive pattern having a line width/space width in a range of from 3 μm/3 μm to 10 μm/10 um.

5. A printed wiring board according to claim 2, wherein the plurality of resin insulation layers has a main component comprising a resin selected from the group consisting of an epoxy resin, a phenolic resin, a polyimide resin, a polyphenylene resin, a polyolefin resin and a fluororesin.

6. A printed wiring board according to claim 1, wherein the intermediate compound layer formed on the electroless copper-plated film has a thickness in a range of from 1 nm to 10 nm.

7. A printed wiring board according to claim 3, wherein each of the conductive layers has a conductive pattern having a line width/space width in a range of from 3 μm/3 μm to 10 μm/10 μm.

8. A printed wiring board according to claim 6, wherein the plurality of resin insulation layers has a main component comprising a resin selected from the group consisting of an epoxy resin, a phenolic resin, a polyimide resin, a polyphenylene resin, a polyolefin resin and a fluororesin.

9. A printed wiring board according to claim 1, wherein each of the conductive layers has a conductive pattern having a line width/space width in a range of from 3 μm/3 μm to 10 μm/10 μm.

10. A printed wiring board according to claim 9, wherein the plurality of resin insulation layers has a main component comprising a resin selected from the group consisting of an epoxy resin, a phenolic resin, a polyimide resin, a polyphenylene resin, a polyolefin resin and a fluororesin.

11. A printed wiring board according to claim 1, wherein the plurality of resin insulation layers has a main component comprising a resin selected from the group consisting of an epoxy resin, a phenolic resin, a polyimide resin, a polyphenylene resin, a polyolefin resin and a fluororesin.

12. A printed wiring board according to claim 1, further comprising:
   a solder resist layer formed on an outermost conductive layer of the plurality of conductive layers and an outermost resin insulation layer of the plurality of resin insulation layers.

13. A printed wiring board according to claim 1, wherein the plurality of conductive layers includes an outermost conductive layer including a plurality of pad portions positioned to mount an electronic component.

14. A printed wiring board according to claim 1, wherein the plurality of conductive layers includes an outermost conductive layer including a plurality of pad portions positioned to mount an electronic component, and each of the pad portions of the outermost conductive layer has a metal film selected from the group consisting of a Ni/Au film, a Ni/Pd/Au film and a Sn film.

15. A printed wiring board according to claim 1, wherein the plurality of conductive layers includes an outermost conductive layer including a plurality of pad portions positioned to mount an electronic component, and each of the pad portions of the outermost conductive layer has an OSP film.

16. A method for manufacturing a printed wiring board, comprising:
   irradiating laser upon a resin insulation layer such that a via opening is formed in the resin insulation layer;
   applying electroless plating on the resin insulation layer such that an electroless copper-plated film is formed on a surface of the resin insulation layer and in the via opening;
   applying microwave plasma treatment on the electroless copper-plated film formed on the surface of the resin insulation layer and in the via opening such that an intermediate compound layer comprising $Cu_3N+Cu$ (NH)x is formed on the electroless copper-plated film on the surface of the resin insulation layer and in the via opening;

forming a plating resist layer having a plating-resist pattern on the intermediate compound layer;

applying electrolytic plating on a portion of the intermediate compound layer exposed from the plating resist layer such that an electrolytic copper-plated film is on the portion of the intermediate compound layer exposed from the plating resist layer, a via conductor comprising the electroless copper-plated film, the intermediate compound layer and the electrolytic copper-plated film is formed in the via opening, and a conductive layer comprising the electroless copper-plated film, the intermediate compound layer and the electrolytic copper-plated film is formed on the surface of the resin insulation layer;

removing the plating resist layer from the intermediate compound layer; and removing a portion of the intermediate compound layer and a portion of the electroless copper-plated film exposed from the electrolytic copper-plated film.

17. A method for manufacturing a printed wiring board according to claim 16, wherein the applying of the microwave plasma treatment comprises applying the microwave plasma treatment on the electroless copper-plated film in a mixed gas atmosphere comprising a nitrogen gas and a hydrogen gas.

18. A method for manufacturing a printed wiring board according to claim 17, wherein the applying of the microwave plasma treatment comprises applying the microwave plasma treatment on the electroless copper-plated film at a pressure in a range of from 25 Pa to 100 Pa, in a concentration of the hydrogen gas in a range of from 0.1% to 5% in volume ratio, and at a temperature in a range of from 30° C. to 150° C.

19. A method for manufacturing a printed wiring board according to claim 16, wherein the applying of the microwave plasma treatment comprises applying the microwave plasma treatment on the electroless copper-plated film at a pressure in a range of from 25 Pa to 100 Pa, in a concentration of the hydrogen gas in a range of from 0.1% to 5% in volume ratio, and at a temperature in a range of from 30° C. to 150° C.

20. A method for manufacturing a printed wiring board according to claim 16, wherein the conductive layer comprising the electroless copper-plated film, the intermediate compound layer and the electrolytic copper-plated film is formed on the surface of the resin insulation layer such that the conductive layer has a conductive pattern having a line width/space width in a range of from 3 μm/3 μm to 10 μm/10 μm.

* * * * *